(12) United States Patent
Kamgaing et al.

(10) Patent No.: US 10,998,879 B2
(45) Date of Patent: May 4, 2021

(54) MONOLITHIC DIE WITH ACOUSTIC WAVE RESONATORS AND ACTIVE CIRCUITRY

(71) Applicant: Intel Corporation, Santa Clara, CA (US)

(72) Inventors: Telesphor Kamgaing, Chandler, AZ (US); Georgios Dogiamis, Chandler, AZ (US); Feras Eid, Chandler, AZ (US); Aleksandar Aleksov, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/550,673

(22) Filed: Aug. 26, 2019

(65) Prior Publication Data

US 2021/0067132 A1 Mar. 4, 2021

(51) Int. Cl.
*H03H 9/08* (2006.01)
*H03H 9/05* (2006.01)
(Continued)

(52) U.S. Cl.
CPC .......... *H03H 9/08* (2013.01); *H01L 23/3675* (2013.01); *H01L 23/49827* (2013.01); *H01L 23/552* (2013.01); *H01L 23/66* (2013.01); *H01L 25/165* (2013.01); *H01L 27/20* (2013.01); *H03H 3/02* (2013.01); *H03H 9/0542* (2013.01); *H03H 9/545* (2013.01); *H03H 9/70* (2013.01); *H01L 24/16* (2013.01); *H01L 24/32* (2013.01); *H01L 24/73* (2013.01); *H01L 2223/6616* (2013.01);
(Continued)

(58) Field of Classification Search
CPC .......... H03H 9/08; H03H 9/02; H03H 9/0542; H03H 9/545; H03H 9/70; H01L 23/3675; H01L 23/49827; H01L 23/552; H01L 23/66; H01L 24/16; H01L 24/32; H01L 24/73; H01L 25/165; H01L 27/20; H01L 2223/6616; H01L 2224/16235; H01L 2224/32245; H01L 2224/73253; H01L 2924/19011; H01L 2924/19042; H01L 2924/30111; H01L 2924/3025
USPC .......................................... 257/659
See application file for complete search history.

(56) References Cited

U.S. PATENT DOCUMENTS

2017/0117230 A1    4/2017  Kumbhat et al.
2017/0365775 A1  12/2017  Adkisson et al.
(Continued)

FOREIGN PATENT DOCUMENTS

JP    2002084155 A    3/2002
WO   2018132742 A1    7/2018

OTHER PUBLICATIONS

International Search Report and Written Opinion in International Patent Application No. PCT/US2020/044128 dated Nov. 11, 2020, 10 pages.

*Primary Examiner* — Tong-Ho Kim
(74) *Attorney, Agent, or Firm* — Patent Capital Group

(57) ABSTRACT

Embodiments may relate to a radio frequency (RF) front-end module (FEM). The RF FEM may include an integrated die with an active portion and an acoustic wave resonator (AWR) portion adjacent to the active portion. The RF FEM may further include a lid coupled with the die. The lid may at least partially overlap the AWR portion at a surface of the die. Other embodiments may be described or claimed.

20 Claims, 9 Drawing Sheets

(51) Int. Cl.
*H03H 9/54* (2006.01)
*H03H 9/70* (2006.01)
*H03H 3/02* (2006.01)
*H01L 23/367* (2006.01)
*H01L 23/498* (2006.01)
*H01L 23/552* (2006.01)
*H01L 23/00* (2006.01)
*H01L 25/16* (2006.01)
*H01L 27/20* (2006.01)
*H01L 23/66* (2006.01)

(52) U.S. Cl.
CPC ............... *H01L 2224/16235* (2013.01); *H01L 2224/32245* (2013.01); *H01L 2224/73253* (2013.01); *H01L 2924/19011* (2013.01); *H01L 2924/19042* (2013.01); *H01L 2924/3025* (2013.01); *H01L 2924/30111* (2013.01)

(56) References Cited

U.S. PATENT DOCUMENTS

| | | |
|---|---|---|
| 2018/0234076 A1 | 8/2018 | Ando et al. |
| 2020/0219861 A1* | 7/2020 | Kamgaing ........ H01L 23/49822 |
| 2020/0235716 A1* | 7/2020 | Eid ..................... H03H 9/1014 |

* cited by examiner

MONOLITHIC DIE WITH ACOUSTIC WAVE RESONATORS AND ACTIVE CIRCUITRY

BACKGROUND

Form-factor reduction and performance improvement of radio frequency (RF) front-end modules (FEMs) may be desirable. Specifically, RF FEMs may be used in a variety of mobile devices or other devices where size of the device, size of the RF FEM, or performance of the RF FEM are considered important design considerations.

DETAILED DESCRIPTION

Figure 1:
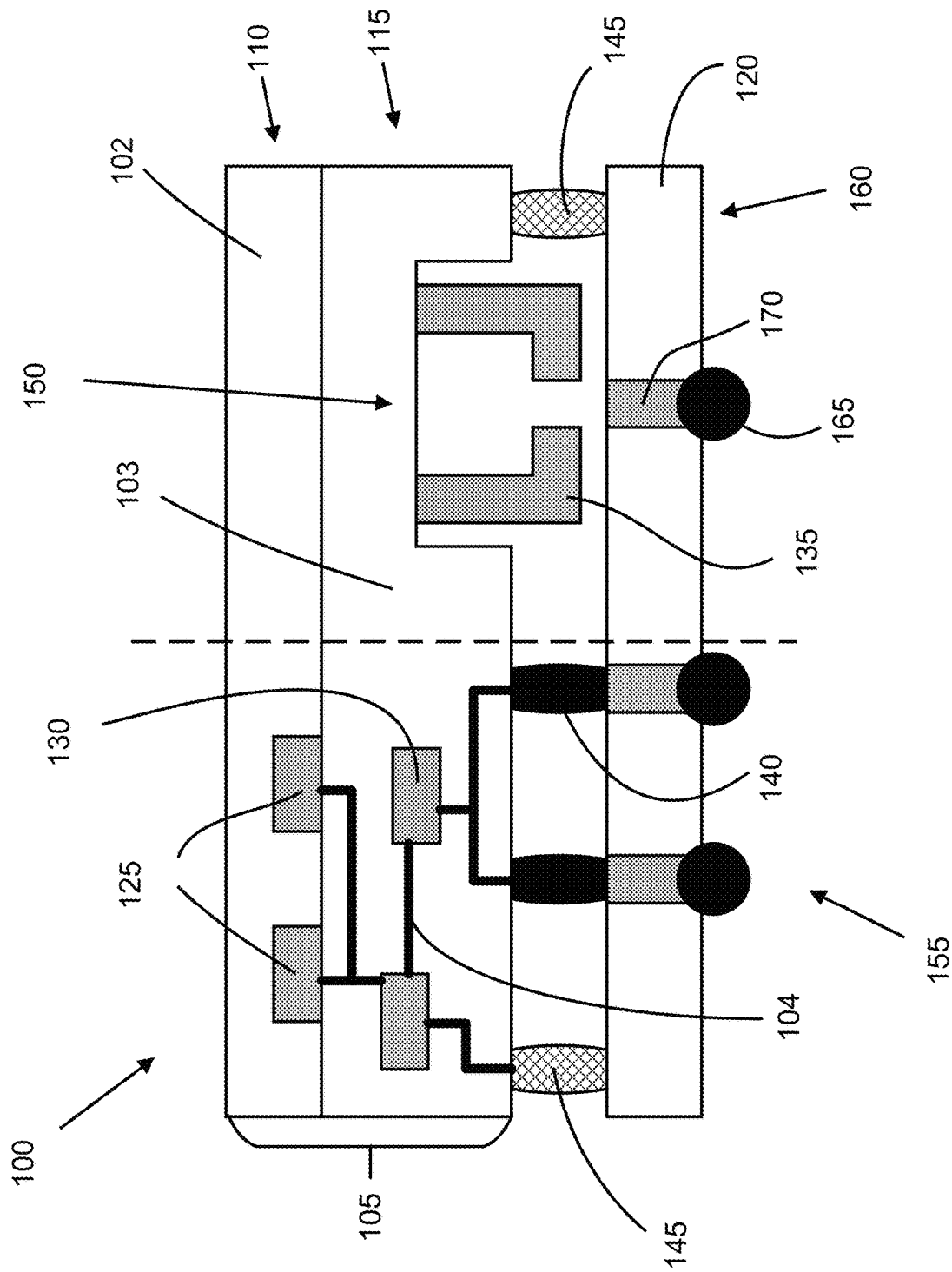
FIG. 1 depicts a simplified example of a RF FEM that includes an integrated die, in accordance with various embodiments.ac

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature [[formed/deposited/disposed/etc.]] on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application-specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As previously noted, form-factor reduction and performance improvement of RF FEMs may be desirable. This reduction or performance improvement may be achieved by co-integrating switches, amplifiers, or filters on the same semiconductor substrate. This integration may introduce challenges related to electrical or thermal cross-talks. Additionally, high-Q passive elements may still be desirable for the sake of signal integrity and power delivery to RF FEM. Therefore, embodiments herein relate to RF FEM architectures for systems where active devices and acoustic resonators are co-integrated on the same die. The resultant die may be referred to herein as, for example an integrated RF die.

In legacy devices RF FEMs for mobile or wireless communications may be designed and implemented using discrete or individual active components such as power amplifiers (PAs), low noise amplifiers (LNAs), switches, and different passive components. However, the integration of discrete components may result in a relatively large form-factor RF FEM because empty or white spaces may be retained on individual dies to accommodate first-level interconnects (FLIs). Additionally, use of multiple discrete components may present difficulties with respect to inventory management or the development of complex tools for use in ultra-small component assembly.

By contrast, embodiments herein may relate to a compact integrated RF FEM that includes one or more active components and one or more acoustic wave resonators (AWRs) co-integrated on the same semiconductor substrate to form an integrated RF die. Additionally, an integrated passive device die (IPD) may be combined with the integrated RF die to realize a functional RF FEM. More specifically, embodiments may relate to monolithically integrating active components with AWR filters on a die. The die, or at least portions of the die, may then be hermetically sealed to provide protection against environmental variables such as humidity, electromagnetic radiation, etc. The sealed die may then be attached to an external element such as a die or package substrate which may provide external passive elements for matching, termination, power delivery, etc. Some embodiments may also include thermal solutions which may be designed specifically for the integrated RF die.

Embodiments may provide a number of benefits or advantages over legacy RF FEMs. For example, monolithic integration of the active components and the AWR(s) may reduce the overall form-factor of the RF FEM, which may lead to both cost reduction and performance improvement. Additionally, integration of the active component(s), AWR(s), and passive element(s) in a three-dimensional (3D) architecture may reduce the overall footprint of the RF FEM. This reduction in footprint may be desirable for use in devices such as mobile or portable devices such as devices that communicate in accordance with the third-generation partnership project (3GPP) fifth generation (5G) technology. Additionally, off-chip integration of passive elements may provide improvements with regards to electrical performance because higher-Q passive elements may be fabricated as opposed to be integrated onto the integrated RF die. Finally, embodiments may provide advantages with respect to thermal solutions because specifically-shaped heat-spreaders may be designed which may take into account the integration of different components.

FIG. 1 depicts a simplified example of a RF FEM 100 that includes an integrated die 105, in accordance with various embodiments. As will be explained in greater detail below, the die 105 may include several portions such as an active portion 155 of the die 105 and an AWR portion 160 of the die 105. The active portion 155 and the AWR portion 160 are depicted in FIG. 1 as separated in accordance with the dashed vertical line. However, it will be understood that the separation of the two portions 155 and 160 may be a logical, rather than a physical, separation. That is, the two portions 155 and 160 may be logically separated for the sake of discussion and description, but the die 105 itself may be a unitary element with a single substrate that spans the two portions 155 and 160.

The active portion 155 may include active circuits such as switches, amplifiers, logic circuits, or other circuits which may be related to RF operation of the RF FEM 100 or the die 105. RF operation may refer to operation in accordance with third-generation (3G) wireless communication, fourth generation (4G) wireless communication, fifth generation (5G) wireless communication, Wi-Fi wireless communication, WiMAX wireless communication, or some other type of wireless communication now known or hereafter developed. The various circuits within the active portion 155 may include elements such as transistors or diodes and passive elements such as inductors, capacitors, resistors, etc. The AWR portion 160 may include standalone resonators or resonators that are connected in specific arrangement to form complete or partial filters, multiplexers, or other resonant circuits. The die 105 may further include various interconnects that may electrically couple the circuits in the active portion 155, the AWR portion 160, or between the active and AWR portions 155/160.

The die 105 may include a front-end 110 and a back-end 115. The front-end 110 may include one or more active elements 125 in the active portion 155 of the die 105. The active elements 125 may include, for example, transistors, diodes, etc. The active elements 125 may be in a substrate 102 which may be or which may include silicon, gallium arsenide, indium phosphide, aluminum nitride, etc.

The back-end 115 may include one or more passive elements 130 in the active portion 155 of the die 105. The passive elements 130 may be in, on, or partially in a substrate 103 that is formed of a material such as silicon dioxide ($SiO_2$) or some other inter-layer dielectric material. The passive elements 130 may be or include a capacitor, an inductor, a resistor, etc. The back-end 115 may further include one or more conductive elements 104 such as vias, pads, traces, microstrips, striplines, etc. The conductive elements 104 may communicatively couple various elements of the die 105 together (e.g., the active elements 125 and the passive elements 130) to form active circuits such as one or more PAs, LNAs, switches, logic, or other active circuits. In some embodiments, the die 105 may include a single active circuit, while in other embodiments the die 105 may include a plurality of active circuits which may or may not be communicatively coupled with one another by the conductive elements 104.

The AWR portion 160 of the die 105 may include one or more AWRs such as AWR 150. The AWR 150 may be, for example, a bulk acoustic wave (BAW) resonator, a thin film bulk acoustic resonator (FBAR), a surface acoustic wave (SAW) resonator, a contour mode resonator (CMR), or some other type of AWR. The AWR 150 may be or may be part of a complete or partial filter, a multiplexer, or some other resonant circuit.

The AWR 150 may include one or more resonators 135. The resonators 135 may be, for example, lithographically defined. That is, the resonators 135 may be formed through lithographic etching of the substrate 103 of the die 105 during the manufacture of the die 105. In this embodiment, one or more of the resonators 135 may be physically or communicatively coupled with the die 105 as depicted. In other embodiments, one or more of the resonators 135 may be physically or communicatively coupled with the lid 120. In some embodiments, one or more of the resonators 135 may be placed at least partially within a cavity in the back-end 115 of the die, as shown, while in other embodiments one or more of the resonators 135 may be on, or adjacent to, the surface of the die 105. In some embodiments one or more of the resonators 135 may be communicatively coupled with an active circuit of the active portion 155 of the die 105. Such communicative coupling may be achieved through one or more conductive elements such as conductive elements 104. In other embodiments, one or more of the resonators 135 may be communicatively coupled with the active circuit through a communicative pathway within the lid 120 that is communicatively coupled with both the resonator 135 and the active circuit in the active portion 155 of the die 105.

The die 105 may be coupled with a lid 120. The lid 120 may be formed of a material such as silicon nitride, an organic material with a silicon nitride finish, ceramic, glass, or some other inorganic material. The lid 120 may be physically or communicatively coupled with the die 105 by interconnects 140, which may be referred to as FLIs. The interconnects 140 may be, for example, solder bumps that are formed of a material such as tin, silver, copper, etc. If solder bumps are used for the interconnects 140, then the solder bumps may be elements of a ball grid array (BGA) as shown in FIG. 1. In other embodiments, the interconnects 140 may be some other type of interconnect. Generally, the interconnects 140 may physically or communicatively couple the die 105 with the lid 120. For example, one or more of the interconnects 140 may physically couple with, and allow electrical signals to pass between, pads of the die 105 and pads of the lid 120 (not shown for the sake of elimination of clutter of FIG. 1). In other embodiments, the interconnects 140 may physically couple the die 105 and the lid 120, but the interconnects 140 may not communicatively couple the die 105 and the lid 120.

The die 105 and the lid 120 may be further coupled by a seal 145. The seal 145 may hermetically seal that cavity formed between the die 105 and the lid 120. As used herein, a hermetic seal may refer to a seal wherein elements within the cavity between the die 105 and the lid 120 are protected from atmospheric or external factors such as heat, humidity, electromagnetic interference, etc. In other words, a hermetic seal may be airtight, watertight, etc. The seal 145 may be formed of rubber, epoxy, gold, copper, or some other material which may provide a hermetic seal of the space between the die 105 and the lid 120. In some embodiments, the seal may not be at an outer portion of the lid 120 or the die 105 as shown, but rather may only hermetically seal a portion of the space between the lid 120 and the die 105. For example, in some embodiments the seal 145 may only be located in the AWR portion 160 of the die 105 and therefore may only provide a hermetic seal for the AWR 150 rather than both the AWR 150 and elements of the active portion 155 of the die 105 as depicted in FIG. 1.

The lid 120 may include a number of conductive elements as noted above. Certain of the conductive elements, which are not shown for the sake of further avoidance of clutter of the Figure, may include one or more vias, traces, pads, microstrips, striplines, etc. which are in or on the lid 120. Generally, the conductive elements may be located in a routing or redistribution layer that is not adjacent to the die 105. In other words, the routing or redistribution layer may be in a portion of the lid 120 that is at a side of the lid 120 that is opposite the side of the lid 120 that faces the die 105. By placing the routing or redistribution layers further from the die, electromagnetic interference to the AWR 150 or the die 105 caused by the routing or redistribution layers may be reduced, minimized, or eliminated. The conductive elements may, for example, communicatively couple the AWR 150 with an interconnect 140. In this manner, the AWR 150 may be communicatively coupled with the active circuit of the active portion 155 of the die 105 through the lid 120.

In some embodiments, the lid 120 may include a number of through-substrate vias (TSVs) 170. The TSVs 170 may be communicatively coupled with the interconnects 140 at a first side of the lid 120. The lid 120 may further include a number of interconnects 165 at the second side of the lid 120. The interconnects 165 may be referred to as second-level interconnects (SLIs), and may be similar to, and share one or more characteristics with, interconnects 140. Specifically, interconnects 165 may be elements of a BGA, a pin grid array (PGA), a land grid array (LGA), a solder grid array (SGA), a socket, etc. The interconnects 165 may be to physically or communicatively couple the RF FEM 100 to another element of an electronic device such as a motherboard, a substrate, an interposer, etc.

Figure 2:
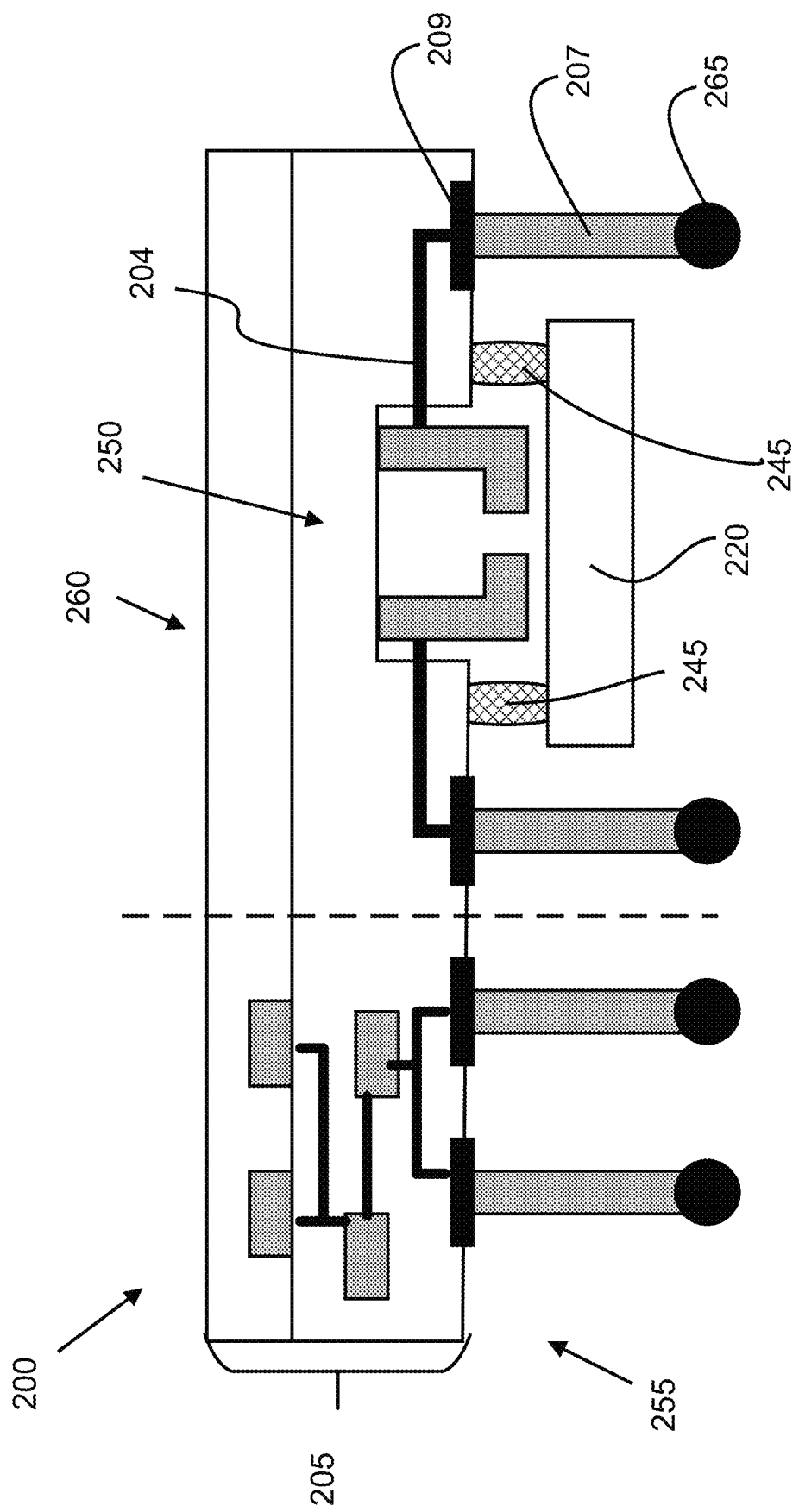
FIG. 2 depicts an alternative simplified example of a RF FEM that includes an integrated die, in accordance with various embodiments.

FIG. 2 depicts an alternative simplified example of a RF FEM 200 that includes an integrated die 205, in accordance with various embodiments. In FIG. 2, a lid 220 may be used in place of the lid 120 of FIG. 1. Lid 120 may be referred to as a "global" lid in that it may span the entirety of the RF FEM 100. By contrast, lid 220 may be referred to as a "localized" lid in that it only spans a portion of the RF FEM 200. In this embodiment, as may be seen, the lid 220 may not include TSVs such as TSVs 170. Rather, fan-out layers of conductive elements may be formed on the die 205 to enable signal redistribution. These fan-out layers may allow for, for example, cost reduction.

For example, the RF FEM 200 may include a die 205 with an active portion 255 and an AWR portion 260, which may be respectively similar to, and share one or more characteristics with, die 105, active portion 155, and AWR portion 160. The RF FEM 200 may further include an AWR 250, which may be similar to, and share one or more characteristics with, AWR 150.

The RF FEM 200 may further include a lid 220 which may be similar to, and share one or more characteristics with, lid 120. However, as noted, the lid 220 may be a localized lid in that it may only span a portion of the RF FEM 200. As shown, the lid 220 may be generally positioned adjacent to the AWR 250, and the lid 220 may be absent from the active portion 255 of the die 205. The RF FEM 200 may include a seal 245 which may be similar to, and share one or more characteristics with, seal 145. The seal 245 may be positioned on the lid such that it generally surrounds, and hermetically seals, the AWR 250.

In this embodiment, as noted, the lid 220 may not include TSVs such as TSVs 170. Rather, one or more conductive elements 204 (which may be similar to conductive elements 104) may be positioned within the die 205 in a fan-out layer (which may also be referred to as a routing or redistribution layer). The conductive elements 204 maybe similar to, and share one or more characteristics with, conductive elements 104.

The conductive elements 204 may be coupled with pads 209 which may be located at the surface of the die 205. Specifically, the pads 209 may be formed of a conductive material such as gold, copper, etc. The pads 209 may be in, on, or partially in the surface of the die 205. The pads 209 may be coupled with one or more pillars 207. The pillars 207 may include a conductive material such as gold, copper, etc. In some embodiments the conductive core may be generally surrounded by a non-conductive material which may prevent, mitigate, or reduce interference or shorts which may be caused by pillars 207 touching one another. The pillars 207 may be coupled with an interconnect 265 which may be similar to, and share one or more characteristics with, interconnects 165.

It will be understood that the embodiments of FIGS. 1 and 2 are intended herein as example of various embodiments, and other embodiments may have one or more variations from the depicted examples. For example, some embodiments may have more or fewer active portions or AWR portions than depicted. Some embodiments may have more or fewer elements such as pads, pillars, interconnects, conductive elements, AWRs, lids, active elements, passive elements, etc. In some embodiments, the various elements may be arranged in a different order than depicted. In some embodiments, one or more of the various elements may be larger or smaller than depicted with respect to other elements of the Figures. Other variations may be present in other embodiments.

Figure 3:
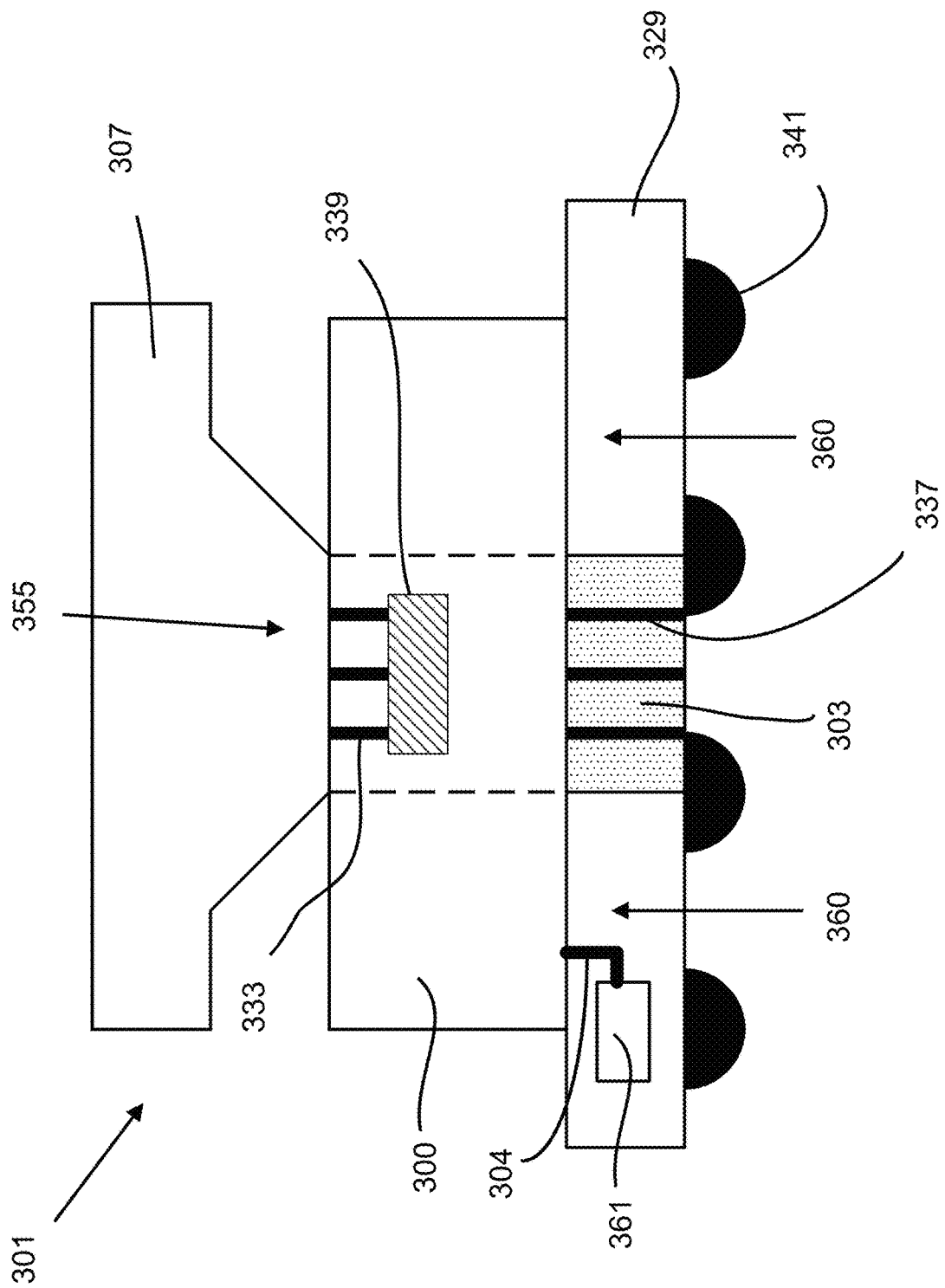
FIG. 3 depicts a simplified example of a microelectronic package that includes an integrated die, in accordance with various embodiments.

As noted above, some embodiments may provide advantages with respect to thermal solutions because specifically-shaped heat-spreaders may be designed which may take into account the integration of different components. FIG. 3 depicts a simplified example of a microelectronic package which includes an integrated die, in accordance with various embodiments. The example microelectronic package may include a thermal solution which may provide one or more of the above-described advantages. In FIG. 3, an integrated die may be positioned between a heat spreader and a package substrate. The heat spreader may be designed to avoid direct contact with the AWR portion of the die. The microelectronic package may include an additional thermal solution in the form of stacked via arrays or metal slugs inside the package substrate. The package substrate may be further designed to include high-Q passive elements which may be used as termination or matching components for circuits on the die. As one example, if a passive element is communicatively coupled with an AWR of the die, then it may be desirable for the passive element to be a high-Q inductor. If the passive element is communicatively coupled with a PA, then it may be desirable for the passive element to be an inductor with a low direct current (DC) series resistance. It will be understood that the package substrate may include a number of passive elements, and one or more of the number of passive elements may be coupled with one or more of the active circuits or elements of active circuits of the die.

Specifically, FIG. 3 depicts a microelectronic package 301. In some embodiments, the microelectronic package 301 may be referred to as an "RF package," or an RF FEM. However, for the sake of avoidance of confusion related to terms, the element labelled 301 will be referred to herein as a microelectronic package that includes an RF FEM similar to those depicted in FIG. 1 or 2.

The microelectronic package 301 may include an RF FEM 300, which may be similar to, and share one or more characteristics with, RF FEMs 100 or 200. In FIG. 3 (and other Figures herein), the RF FEM may be depicted as a highly simplified element for the sake of simplification of the Figure and lack of redundancy. The RF FEM 300 may include an active portion 355 and a plurality of AWR portions 360, which may be respectively similar to, and share one or more characteristics with, active portion 155 and AWR portion 160. It will be understood that, similarly to RF FEMs 100 or 200, the specific number of configuration of the active portion 355 and the AWR portions 360 are intended as examples of one embodiments, and other embodiments may have more active portions, more or fewer AWR portions 360, the portions 355/360 configured differently across the length of the RF FEM 300, etc.

The RF FEM 300 may be coupled with a heat spreader 307. Although not shown, in some embodiments a thermal interface material (TIM) may be positioned between the RF FEM 300 and the heat spreader 307. The heat spreader 307 may draw thermal energy from the RF FEM 300, and particularly from active circuitry 339 of the RF FEM. The heat spreader 307 may then distribute the thermal energy away from the microelectronic package 301, for example through a thermal coupling with a thermal solution such as a vapor chamber, air or water-cooled fins, or some other thermal solution.

As described above, the active circuitry 339 may include one or more passive elements, active elements, and conductive elements such as passive elements 130, active elements 125, and conductive elements 104. Generally, the active circuitry 339 may facilitate transmission, reception, processing, or other operations that may be related to RF operation of the RF FEM 300 or the microelectronic package 301.

In some embodiments, the active circuitry 339 may be thermally coupled with the heat spreader 307 through, for example, blind vias such as blind vias 333. The blind vias 333 may be thermally conductive pathways formed of a thermally conductive material such as copper, aluminum, or some other material. The blind vias 333 may, for example, be positioned in the substrate of the front-end of the RF FEM 300. The blind vias 333 may facilitate transmission of thermal energy from the active circuitry 339 to the heat spreader 307.

Returning to the heat spreader 307, the heat spreader 307 may be formed of a thermally conductive material such as copper, aluminum, or some other material. As can be seen, the heat spreader 307 may thermally contact the RF FEM 300 (or particularly the integrated die of the RF FEM 300) at the active portion 355 of the RF FEM 300, while not contacting the RF FEM 300 at the AWR portion 360 of the RF FEM 300. In some embodiments, the heat spreader 307 may have a total z-height (as measured vertically with respect to the orientation of FIG. 3) between approximately 500 micrometers ("microns" or "µm") and approximately 2 millimeters (mm). The heat spreader 307 may be separated from the RF FEM 300 at the AWR portion 360 by between approximately 50 microns and approximately 500 microns as measured in a direction parallel to the z-height. It will be understood that these are example measurements, and other embodiments may be larger or smaller than described. The thickness of the heat spreader 307 or the distance by which the heat spreader 307 is separated from the RF FEM 300 at the AWR portion 360 may be based on, for example, the device in which the microelectronic package 301 may be used. If the device is, for example, a small portable device such as a smartphone, then the measurements may be relatively low in order to create a generally small form-factor for the microelectronic device 300. If the device is, for example, a network access point, an internet of things (IoT) device, or some other larger device, then the measurements may be relatively high in order to maximize the effectiveness of the heat spreader 307. Other factors may likewise affect the z-height of the heat spreader 307 or the offset between the heat spreader 307 and the RF FEM 300.

It will be understood that this depiction of the heat spreader 307 is intended as one example, and other embodiments may be shaped differently. For example, in some embodiments the heat spreader 307 may have a footprint that is different than that of the RF FEM 300. In some embodiments, the heat spreader 307 may be taller or shorter than depicted. In some embodiments, the heat spreader may not be entirely linear as depicted, but rather may be curved, may be more generally "T" shaped, or may have some other shape than depicted. Additionally, it will be understood that in this embodiment the heat spreader 307 may be described as being "physically separated" from the RF FEM 300 at the AWR portion 360. As used herein, the term "physically separated" with respect to the RF FEM 300 and the heat spreader 307 may mean that the heat spreader 307 may not directly physically contact the RF FEM 300 at the AWR portion 360. However, there may be one or more intervening materials which may be physically coupled with, and positioned between, the RF FEM 300 and the heat spreader 307. Such materials may include, for example, mold, air, underfill, etc.

The RF FEM 300 may further be coupled with a package substrate 329, for example by interconnects such as interconnects 165 or 265. The package substrate 329 may be, for example, considered to be a cored or coreless substrate. The package substrate 329 may include one or more layers of a dielectric material which may be organic or inorganic. The package substrate 329 may further include one or more conductive elements such as vias, pads, traces, microstrips, striplines, etc. The conductive elements may be internal to, or on the surface of, the package substrate. Generally, the conductive elements may allow for the routing of signals through the package substrate 329, or between elements that are coupled to the package substrate 329. The package substrate 329 may further include one or more interconnects 341, which may be referred to as SLIs. The interconnects 341 may be similar to, and share one or more characteristics with, interconnects 165 or 265.

The package substrate 329 may further include a package thermal solution 303. The package thermal solution 303 may be formed of, for example, lead, aluminum, copper, etc. Similarly to the heat spreader 307, the package thermal solution 303 may be configured to draw thermal energy from the RF FEM 300, for example to distribute it away from the microelectronic package 301. In some embodiments, the package thermal solution 303 may include one or more thermal interconnects 337 as shown. The thermal interconnect(s) 337 may be, for example, a blind via such as blind via 333, a stacked via, a metal slug, etc.

In some embodiments, as noted above, the package substrate 329 may include one or more passive elements such as passive element 361. The passive element 361 may be similar to, and share one or more characteristics with, passive element 130. The passive element 361 may be, for example, an inductor or some other passive element. The passive element 361 may be communicatively coupled with, for the example, the active circuitry 339. In other embodiments, the passive element 361 may be communicatively coupled with an AWR of an AWR portion 360. Specifically, the passive element 361 may be coupled with an interconnect of the RF FEM 300 (e.g., an interconnect similar to interconnect 165 or 265) through a conductive element 304, which may be similar to, and share one or more characteristics with, conductive elements 104. Through the interconnect, the passive element 361 may be communicatively coupled to a conductive element of the RF FEM 300 (e.g., conductive elements 104) and hereby to active element 125, passive elements 130, AWRs 150, or some combination thereof.

As noted above, the passive element 361 may be used for matching, termination, or some other function related to the RF FEM 300. The type or configuration of the passive element 361 may be based on the function to which it will be put, and the element of the RF FEM 300 to which it may be coupled. In some embodiments, the package substrate 329, the RF FEM 300, or both may include one or more additional vias which may form a radio frequency interference (RFI) cage around all or part of the active portion 355 to provide electromagnetic (EM) shielding to the active portion 355.

In some embodiments, in order to reduce the overall footprint of the RF FEM, some passive elements may be displaced from the package substrate onto an integrated passive device (which may be referred to herein as a passives substrate). The passives substrate may be connected directly to the package substrate, or indirectly through TSVs in the RF FEM (or the integrated die of the RF FEM).

Figure 4:
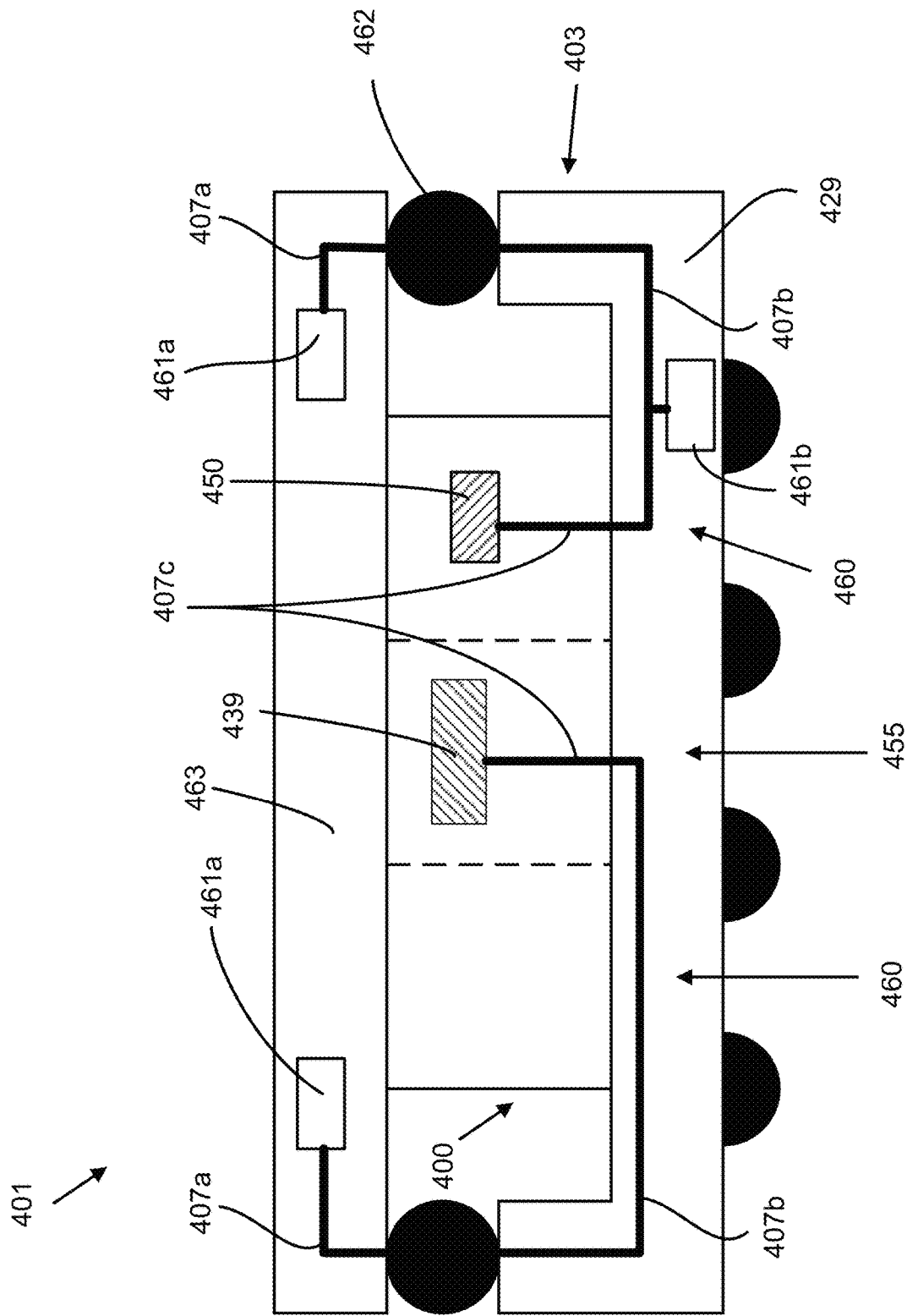
FIG. 4 depicts an alternative simplified example of a microelectronic package that includes an integrated die, in accordance with various embodiments.

FIG. 4 depicts an alternative simplified example of a microelectronic package that includes an integrated die, in accordance with various embodiments. More specifically, FIG. 4 depicts an example of a microelectronic package 401 which may include a passives substrate 463 which is coupled directly with a package substrate 429.

The microelectronic package 401 may include an RF FEM 400 coupled with a package substrate 429, which may be respectively similar to, and share one or more characteristics with, RF FEM 300 and package substrate 329. The RF FEM 400 may include an active portion 455 and AWR portions 460 which may be respectively similar to, and share one or more characteristics with, active portion 355 and AWR portions 360. The RF FEM 400 may further include active circuitry 439, which may be similar to, and share one or more characteristics with, active circuitry 339. Similarly, the RF FEM 400 may include an AWR 450 which may be similar to, and share one or more characteristics with, AWR 150.

The passives substrate 463 may be formed of a substrate material that is similar to that of package substrate 329 discussed above. The passives substrates 463 may be coupled with the package substrate by an interconnect 462 which may be similar to, and share one or more characteristics with, interconnects 341. Specifically, the package substrate 429 may include one or more arms 403 which may extend at least partially upwards (as oriented with respect to FIG. 4) from the package substrate 429). The interconnects 462 may then be positioned between, and physically or communicatively coupled with, the arms 403 and the passives substrate 463. It will be understood that in other embodiments, the passives substrate 463 may include arms similar to arms 403 instead of or in addition to the arms 403 of the package substrate 429. In some embodiments, neither the package substrate 429 or the passives substrate 463 may include arms, and the interconnects 462 may take the form of pillars that extend between, and are physically or communicatively coupled to, the substrates 429 and 463 (or pads thereof). Other variations may be present in other embodiments.

As noted, it may be desirable to offload one or more of the passive components of the RF FEM 400 or the package substrate 429 to the passives substrate 463. The passives element 461a of the passives substrate 463 may be similar to, and share one or more characteristics with, passive elements 130 or 361. Generally, the passive element 461a of the passives substrate 463 may be an inductor or some other component which is communicatively coupled with a passive element 461b of the package substrate 429, or an element of the RF FEM 400 such as the active circuitry 439 or the AWR 450. The passive element 461b may be similar to, and share one or more characteristics with, passive element 461a.

Specifically, the passive element 461a may be coupled with interconnect 462 by a conductive pathway 407a which may include one or more conductive elements such as conductive elements 104. Specifically, the conductive pathway 407a may include one or more pads, vias, traces, microstrips, striplines, etc. form of a material such as copper, gold, etc. that allow electrical signals to traverse between the passive element 461a and the interconnect 462. Similarly, the package substrate 429 may include one or more conductive pathways 407b which may be similar to, and share one or more characteristics of, conductive pathway 407a. The conductive pathway 407b may communicatively couple the RF FEM 400 with the interconnect 462. The RF FEM 400 may likewise include one or more conductive pathways 407c which may include, for example, elements such as interconnects 165 or 140, TSVs 170, conductive elements 104, etc. In this manner, the passive elements 461a may be communicatively coupled with a passive element 461b of the package substrate 429, active circuitry 439, AWR 450, or some other element of the microelectronic package 401.

Figure 5:
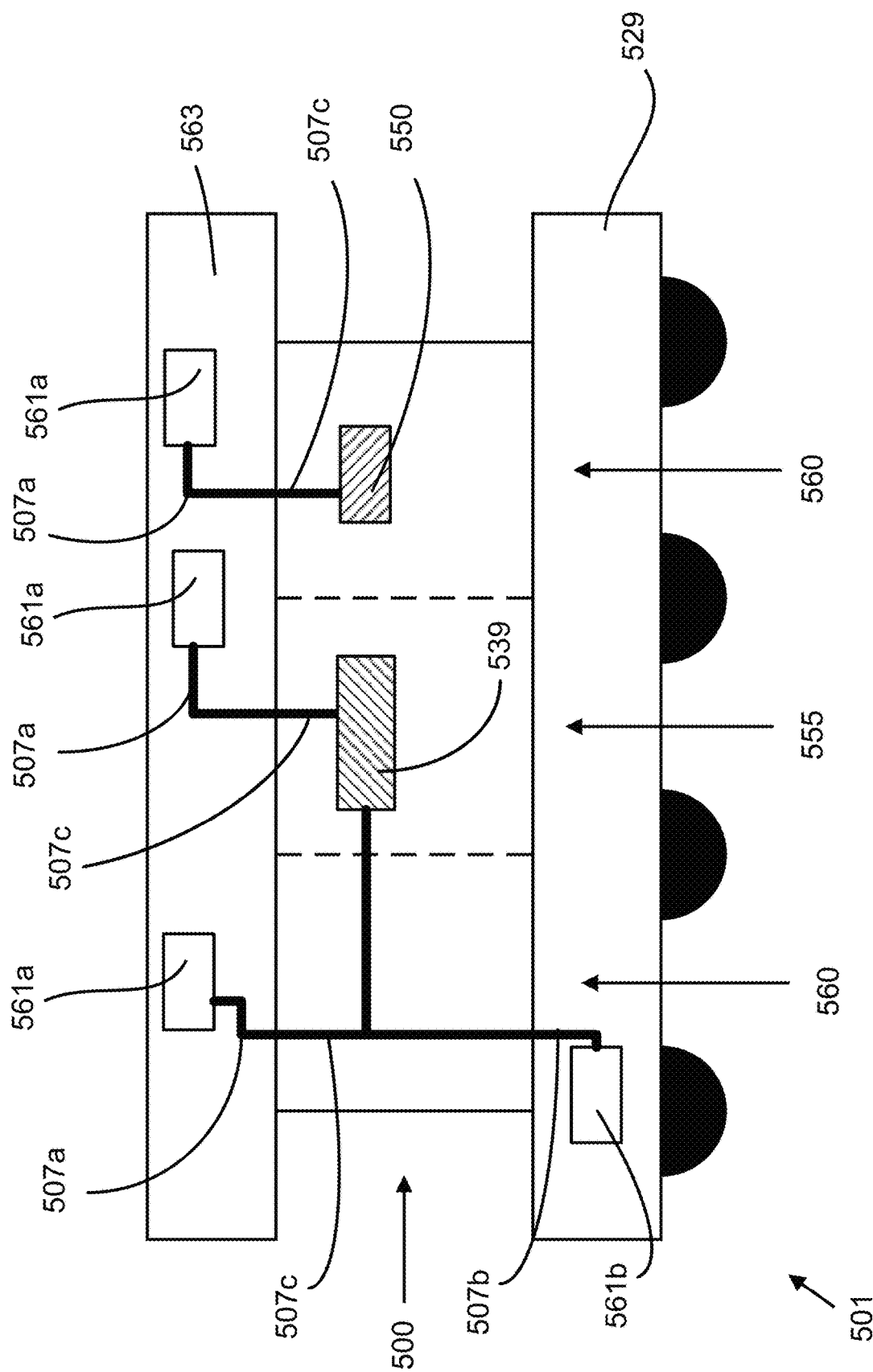
FIG. 5 depicts an alternative simplified example of a microelectronic package that includes an integrated die, in accordance with various embodiments.

FIG. 5 depicts an alternative simplified example of a microelectronic package 501 that includes an integrated die, in accordance with various embodiments. Specifically, FIG. 5 depicts an alternative configuration of a microelectronic package 501 which includes a passives substrate 563.

Generally, the microelectronic package 501 may include an RF FEM 500 which may be similar to, and share one or more characteristics of, RF FEM 300. The RF FEM 500 may have an active portion 555 and AWR portions 560 which may be respectively similar to, and share one or more characteristics with, active portions 355 and AWR portions 360. The RF FEM 500 may further include active circuitry 539, which may be similar to, and share one or more characteristics with, active circuitry 339. Similarly, the RF FEM 500 may include an AWR 550 which may be similar to, and share one or more characteristics with, AWR 150. The RF FEM 500 may be coupled with a package substrate 529 which may be similar to, and share one or more characteristics with, package substrate 329.

The microelectronic package 501 may further include a passives substrate 563 that has passive elements 561a, which may be respectively similar to, and share one or more characteristics with, passives substrate 463 and passive elements 461a. As can be seen in FIG. 5, rather than being communicatively coupled with the RF FEM 500 or the package substrate 529 through interconnects such as interconnects 462, the passive elements 561a may be more directly communicatively coupled with the RF FEM 500 or, through the RF FEM 500, a passive element 561b of the package substrate 529 (which may be similar to, and share one or more characteristics with, passive element 461b).

More specifically, the passives substrate 563 may include one or more conductive pathways 507a which may be similar to, and share one or more characteristics with, conductive pathways 407a. The conductive pathways 507a may be communicatively coupled with conductive pathways 507c of the RF FEM 500 which may be similar to, and share one or more characteristics with, conductive pathways 407c. For example, the conductive pathways 407c may include elements such as interconnects 165 or 140, TSVs 170, conductive elements 104, etc. The conductive pathways 507a and 507c may together facilitate the traversal of electrical signals between a passive element 561 and an element of the RF FEM 500 such as active circuitry 539 or the AWR 550. In some embodiments, a conductive pathway 507c may be communicatively coupled with a conductive pathway 507b of package substrate 529, which may be similar to, and share one or more characteristics with, conductive pathway 407b. The conductive pathways 507a, 507b, and 507c may together allow for the traversal of electrical signals between passive elements 561a/561b and active circuitry 539 (or, not depicted for the sake of lack of redundancy, between passive elements 561a/561b and AWR 550).

It will be understood that the embodiments depicted and described herein are intended as examples of various embodiments of this disclosure, and other embodiments may have variations. For example, the specific routing of conductive pathways or elements, the number or relative sizes of various elements, etc. may be different in other embodiments. Some elements may not be present in some embodiments, while in others certain elements may be included that are not depicted in the Figures herein. For example, in some embodiments one or more intermediate elements may be positioned between an RF FEM and a passives substrate or a package substrate. Such elements may include, e.g., an interposer, a mold material, an underfill material, etc. Characteristics of some embodiments may be combined with characteristics of other embodiments (e.g., the heat spreader of FIG. 3 may be used in conjunction with a passives substrate, etc.). Additionally, it will be understood that each and every element of the various Figures may not be labelled for the sake of lack of redundancy. However, elements that are similar to one another within a Figure, or between a Figure, may share one or more characteristics with each other. Other variations may be present in other embodiments.

Figure 6:
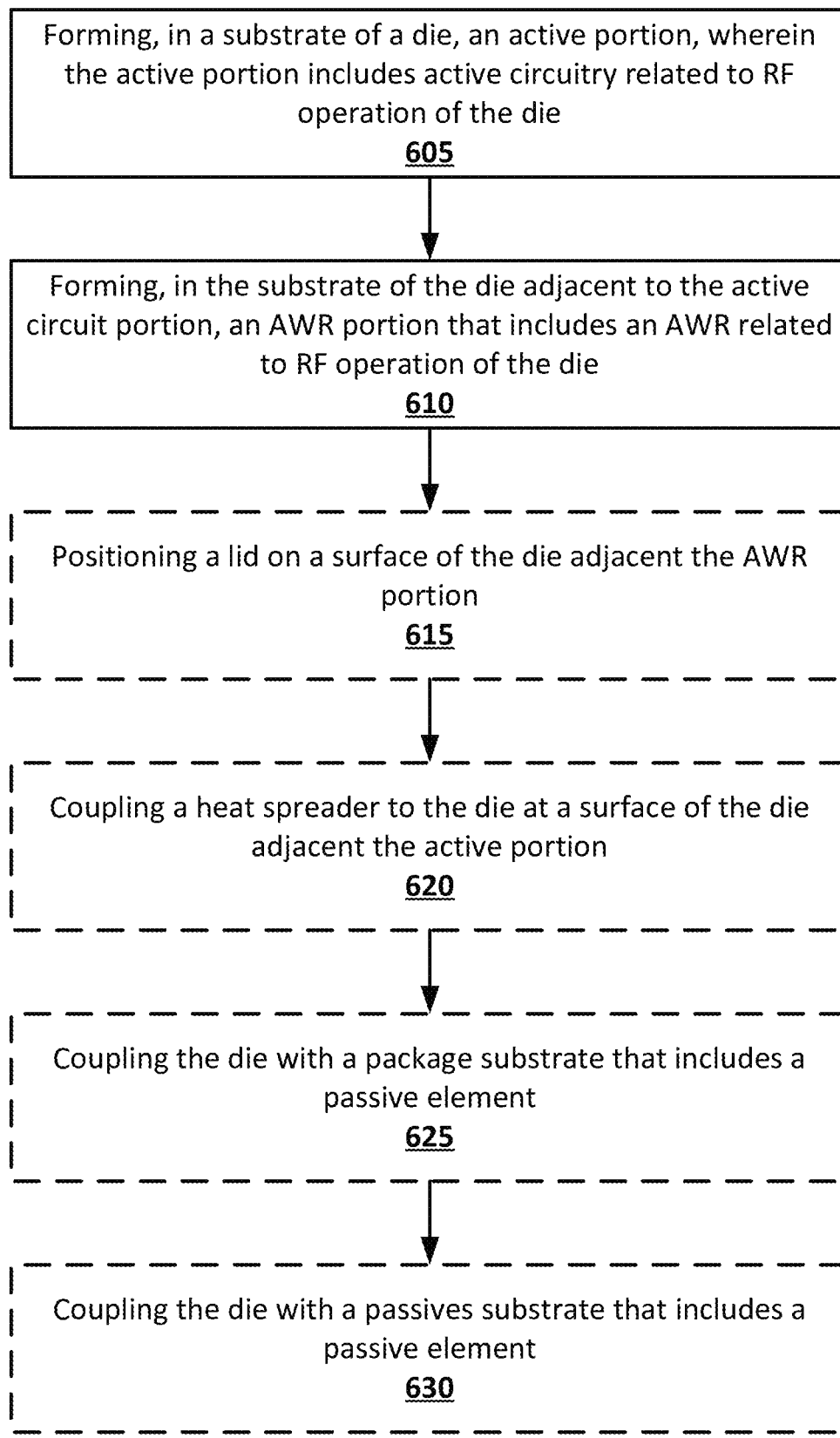
FIG. 6 depicts an example technique for manufacturing an RF assembly that includes an integrated die, in accordance with various embodiments.

FIG. 6 depicts an example technique for manufacturing an RF assembly such as an RF FEM or a microelectronic package, in accordance with various embodiments. Generally, embodiments herein may be described with respect to various specific elements of the Figures, however it will be understood that the described technique may be applicable, in whole or in part, with or without modification, to embodiments of other Figures.

The technique may include forming, at 605, in a substrate of a die, an active portion. The die may be similar to, for example, die 105. The active portion may be similar to, for example active portion 155. The substrate may be similar to, for example, substrate 103. The active portion may include active circuitry such as active circuitry 339 which is related to RF operation of the die.

The technique may further include forming, at 610, in the substrate of the die, an AWR portion such as AWR portion 160. The AWR portion may be adjacent to the active portion and may include an AWR such as AWR 150 that is related to RF operation of the die.

The technique may optionally further include positioning, at 615, a lid on the surface of the die adjacent the AWR portion. The lid may be similar to, for example, lid 120 or 220.

The technique may optionally further include coupling, at 620, a heat spreader to the die. The heat spreader may be similar to, for example, heat spreader 307. The heat spreader may be coupled to the die adjacent the active portion of the die as depicted, for example, at FIG. 3.

The technique may optionally further include coupling, at 625, the die with a package substrate that includes a passive element. The package substrate may be similar to, for example, package substrate 329. The passive element may be similar to, or example, passive element 361. The coupling may be a direct physical coupling, or the coupling may include one or more intermediate elements such as pillars 207, interconnects 165, etc. In some embodiments, the coupling may include communicatively coupling an element of the die with the passive element through, for example, one or more conductive elements or pathways as discussed herein.

The technique may optionally further include coupling, at 630, the die with a passives substrate that includes a passive element. The passives die may be similar to, for example, passives die 463 or 563. The passive element may be similar to, for example, passive elements 461a or 561a. In some embodiments, the die may be directly communicatively coupled with the passives substrate (e.g., as depicted in FIG. 5) while in other embodiments the die may be communicatively coupled with the passives substrate through the package substrate and one or more interconnects (e.g., as depicted in FIG. 4). In some embodiments, one or more elements such as an overmold material, an intermediate heat spreader, etc. may be positioned between the die and the passives substrate.

It will be understood that this technique is intended as one example technique, and other embodiments may have variations from this technique. For example, certain elements may be performed in an order different than one another, or concurrently with one another. Certain elements of the technique may not be present, or other elements may be introduced that are not depicted in FIG. 6. Other variations may be present in other embodiments.

Figure 7:
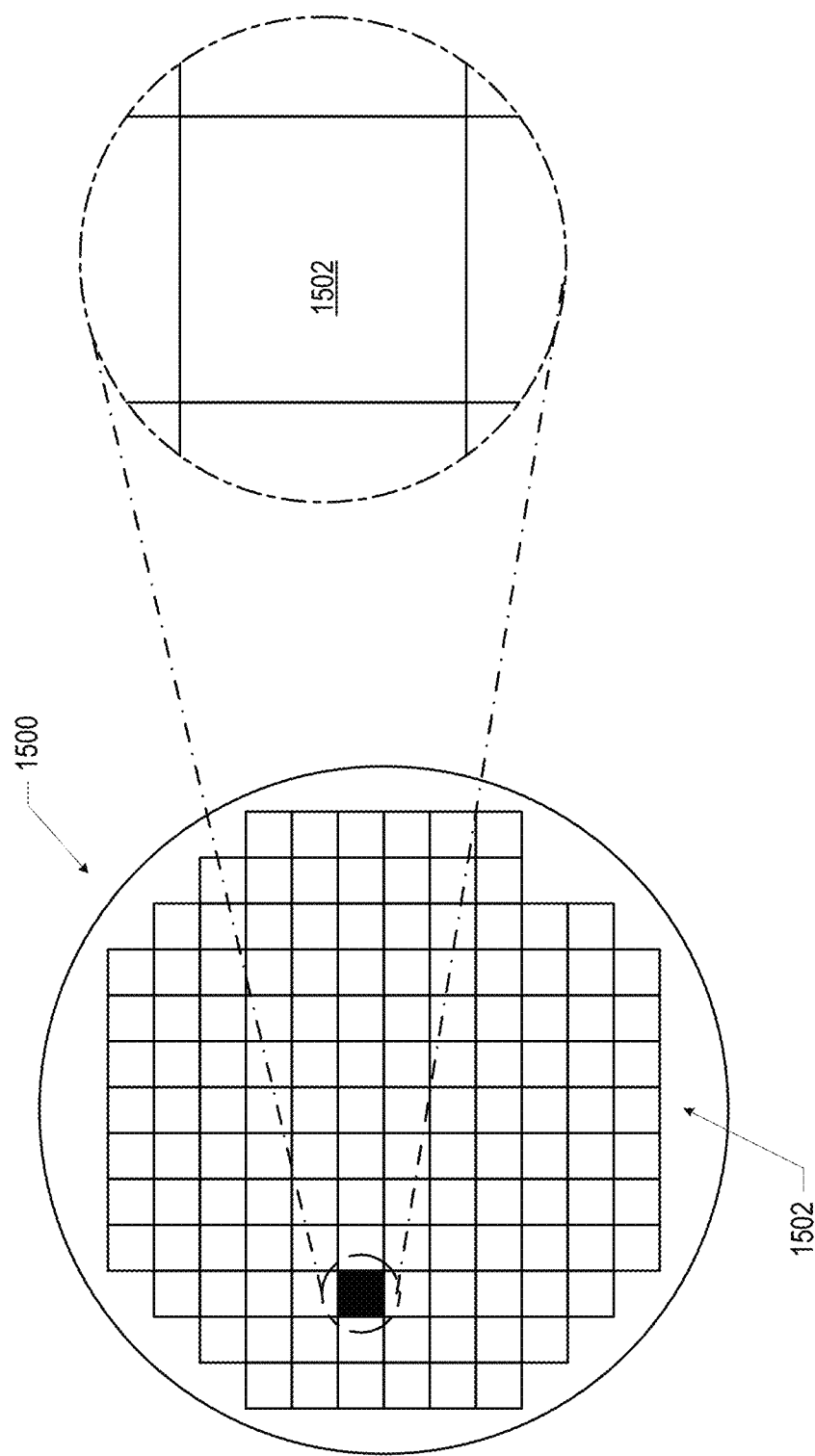
FIG. 7 is a top view of a wafer and dies that may include an integrated die, in accordance with various embodiments.

FIG. 7 is a top view of a wafer 1500 and dies 1502 that may include one or more integrated dies as described herein, or may be included in an IC package including one or more integrated dies, in accordance with various embodiments. The wafer 1500 may be composed of semiconductor material and may include one or more dies 1502 having IC structures formed on a surface of the wafer 1500. Each of the dies 1502 may be a repeating unit of a semiconductor product that includes a suitable IC. After the fabrication of the semiconductor product is complete, the wafer 1500 may undergo a singulation process in which the dies 1502 are separated from one another to provide discrete "chips" of the semiconductor product. The die 1502 may include one or more transistors or supporting circuitry to route electrical signals to the transistors, or some other IC component. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 9) or other logic that is configured to store information in the memory devices or execute instructions stored in the memory array.

Figure 8:
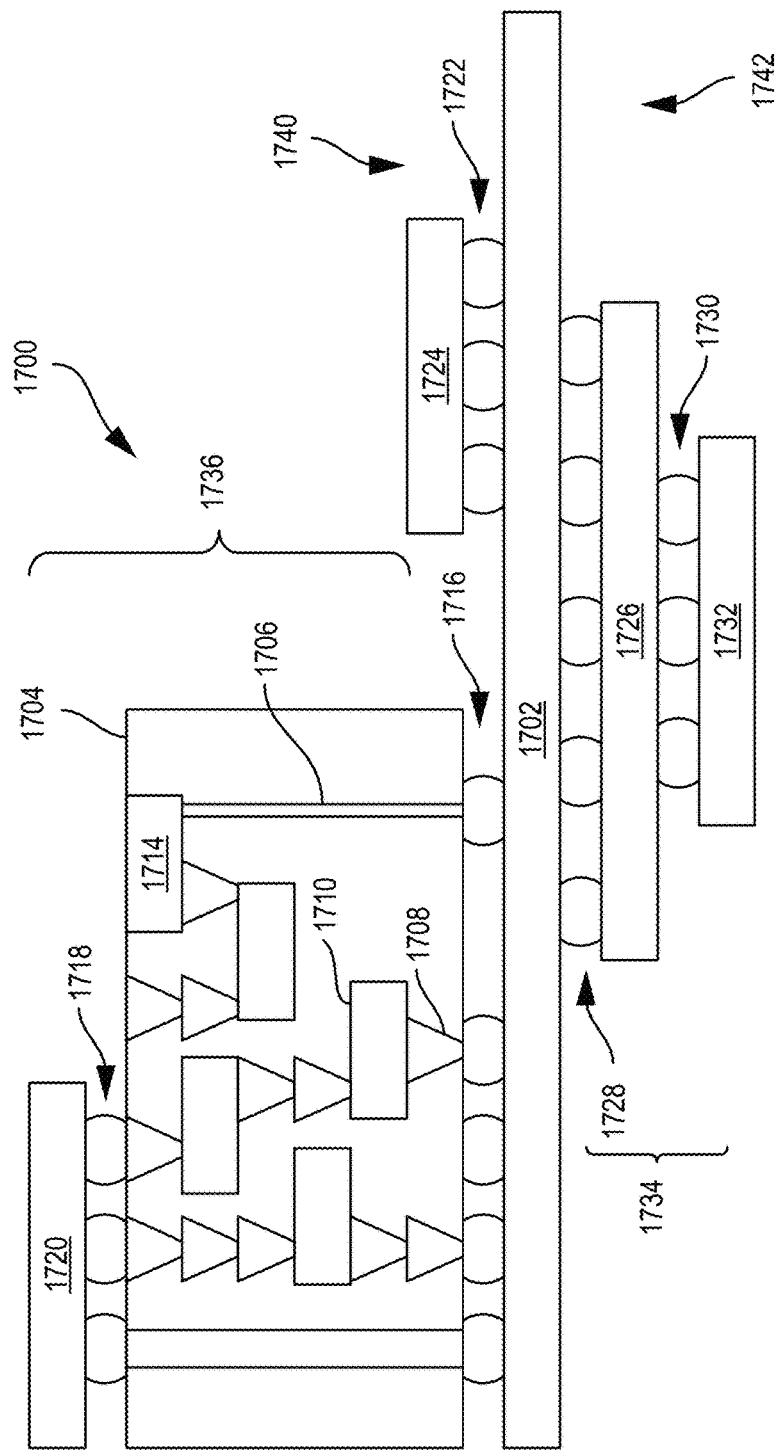
FIG. 8 is a side, cross-sectional view of an integrated circuit (IC) device assembly that may include an RF FEM with an integrated die, in accordance with various embodiments.

FIG. 8 is a side, cross-sectional view of an IC device assembly 1700 that may include one or more IC packages or other electronic components (e.g., a die) including one or more RF FEMs with an integrated die, or one or more integrated dies, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 8 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 8), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 8, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 7), an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 8, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 8 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 9:
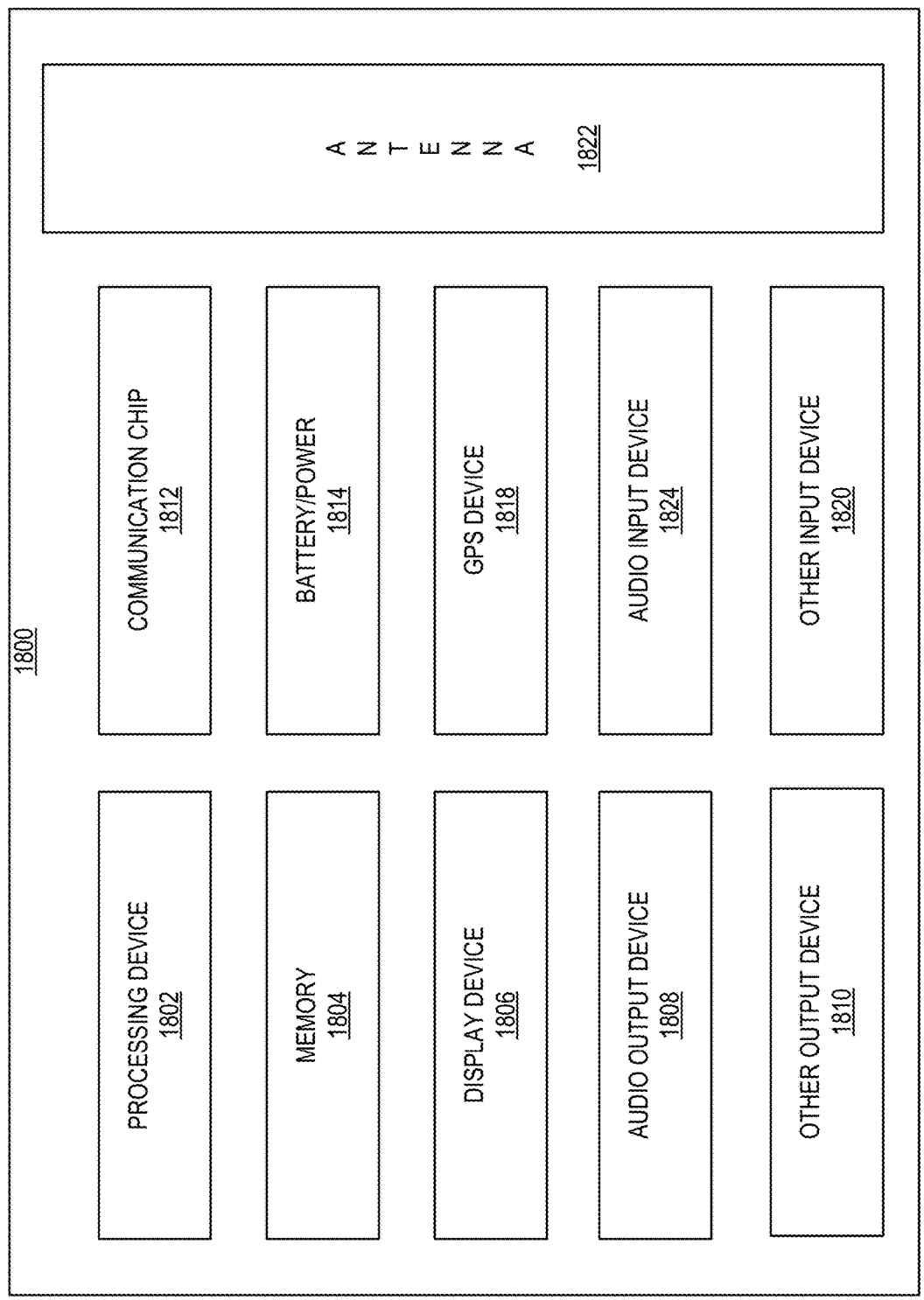
FIG. 9 is a block diagram of an example electrical device that may include an RF FEM with an integrated die, in accordance with various embodiments.

FIG. 9 is a block diagram of an example electrical device 1800 that may include one or more RF FEMs with an integrated die, in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 9 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 9, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), ASICs, central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form-factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes a RF FEM comprising: an integrated die that includes: an active portion that includes an active RF circuit; and an AWR portion adjacent to the active RF circuit, wherein the AWR portion includes an AWR; and a lid coupled with the die, wherein the lid at least partially overlaps the AWR portion at a surface of the die.

Example 2 includes the RF FEM of example 1, wherein the active portion includes active circuitry related to a power amplifier, a low noise amplifier, a switch, or a logic circuit.

Example 3 includes the RF FEM of example 1, wherein the active portion includes a transistor.

Example 4 includes the RF FEM of example 1, wherein the AWR is related to a filter, a partial filter, or a multiplexer.

Example 5 includes the RF FEM of example 1, wherein the lid further at least partially overlaps the active portion.

Example 6 includes the RF FEM of example 1, wherein the lid is coupled with the die by a sealing element that provides a hermetic seal to a cavity between the lid and the die, and wherein the AWR includes a resonator in the cavity.

Example 7 includes the RF FEM of any of examples 1-6, wherein the lid includes a passive element communicatively coupled with the AWR.

Example 8 includes the RF FEM of example 7, wherein the passive element is related to matching or termination of the AWR.

Example 9 includes the RF FEM of any of examples 1-6, wherein the die includes a plurality of vias that are to provide electromagnetic (EM) shielding to the active portion.

Example 10 includes a microelectronic package that comprises: a die for use in a RF FEM, wherein the die includes: an active portion in in a substrate of the die, and wherein the active portion includes active RF circuitry; and an AWR portion adjacent to the active portion, wherein the AWR area includes an AWR; and a heat spreader coupled with the die.

Example 11 includes the microelectronic package of example 10, wherein the heat spreader is coupled with the active portion of the die.

Example 12 includes the microelectronic package of example 11, wherein the heat spreader is physically separated from the die at the AWR portion.

Example 13 includes the microelectronic package of any of examples 10-12, wherein the microelectronic package further comprises a package substrate coupled with the die such that the die is positioned between the package substrate and the heat spreader.

Example 14 includes the microelectronic package of example 13, wherein the package substrate includes a passive element that is communicatively coupled with the die.

Example 15 includes the microelectronic package of example 14, wherein: the passive element is a high-Q inductor that is communicatively coupled with the AWR; or the passive element is a low direct current (DC) series resistant inductor that is coupled with the active RF circuitry.

Example 16 includes the microelectronic package of example 13, wherein the package substrate includes a thermal element that is thermally coupled with the active RF circuitry.

Example 17 includes the microelectronic package of example 16, wherein the thermal element is adjacent to the active portion, and wherein the thermal element does not overlap the AWR portion.

Example 18 includes the microelectronic package of example 16, wherein the thermal element is a blind via, a stacked via, or a metal slug.

Example 19 includes a microelectronic package comprising: a die for use in a RF FEM, wherein the die includes: an active portion that includes active RF circuitry; and an AWR portion, wherein the AWR portion includes an AWR; a package substrate coupled with a first side of the die; and a passives substrate coupled with a second side of the die that is opposite the first side of the die.

Example 20 includes the microelectronic package of example 19, wherein the passives substrate includes a capacitor, a resistor, or an inductor.

Example 21 includes the microelectronic package of examples 19 or 20, wherein the passives substrate is communicatively coupled with the package substrate by an interconnect physically coupled with, and positioned between, the passives substrate and the package substrate.

Example 22 includes the microelectronic package of examples 19 or 20, wherein the passives substrate is communicatively coupled with the package substrate by a conductive pathway in the die.

Example 23 includes a method of forming a RF assembly, wherein the method comprises: forming, in a substrate of a die, an active portion, wherein the active portion includes an active circuit related to RF operation of the die; and forming, in the substrate of the die adjacent to the active portion, an AWR portion that includes an AWR related to RF operation of the die.

Example 24 includes the method of example 23, wherein RF operation is related to transmission or reception of wireless signals by an electronic device to which the die is coupled or of which the die is a part.

Example 25 includes the method of example 23, wherein forming the AWR portion includes lithographically defining a resonator of the AWR.

Example 26 includes the method of any of examples 23-25, wherein the method further comprises positioning a lid on a surface of the die adjacent to the AWR portion.

Example 27 includes the method of example 26, wherein the method further comprises positioning the lid on the surface of the die adjacent to the active circuit portion.

Example 28 includes the method of any of examples 23-25, wherein the method further comprises coupling a heat spreader to the die at a surface of the die.

Example 29 includes the method of example 28, wherein the method comprises coupling the heat spreader to the die at a portion of the surface of the die adjacent the active portion.

Example 30 includes the method of example 29, wherein the method further comprises not coupling the heat spreader to the die at a portion of the surface of the die that is adjacent the AWR portion.

Example 31 includes the method of any of examples 23-25, wherein the method further comprises coupling the die with a package substrate that include a first passive element.

Example 32 includes the method of example 31, wherein the method further comprises coupling the first passive element with the AWR or the active circuit.

Example 33 includes the method of example 31, further comprising thermally coupling the active circuit with a thermal element of the package substrate.

Example 34 includes the method of example 31, further comprising coupling the die with a passives substrate that includes a second passive element.

Example 35 includes the method of example 34, wherein coupling the die with the passives substrate includes coupling the die with the passives substrate such that the die is between the passives substrate and the package substrate.

Example 36 includes the method of example 34, further comprising communicatively coupling the first and second passive elements by an interconnect positioned between, and physically coupled with, the package substrate and the passives substrate.

Example 37 includes the method of example 34, further comprising communicatively coupling the first and second passive elements by a conductive pathway of the die.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A radio frequency (RF) front-end module (FEM) comprising:
an integrated die that includes:
an active portion that includes an active RF circuit, and
an acoustic wave resonator (AWR) portion adjacent to the active RF circuit, wherein the AWR portion includes an AWR;
a lid coupled with the die, wherein the lid at least partially overlaps the AWR portion at a surface of the die; and
a thermal element that is thermally coupled with the die, wherein the thermal element includes a blind via or a metal slug.

2. The RF FEM of claim 1, wherein the active portion includes active circuitry related to a power amplifier, a low noise amplifier, a switch, or a logic circuit.

3. The RF FEM of claim 1, wherein the active portion includes a transistor.

4. The RF FEM of claim 1, wherein the AWR is related to a filter, a partial filter, or a multiplexer.

5. The RF FEM of claim 1, wherein the lid further at least partially overlaps the active portion.

6. The RF FEM of claim 1, wherein the lid is coupled with the die by a sealing element that provides a hermetic seal to a cavity between the lid and the die, and wherein the AWR includes a resonator in the cavity.

7. The RF FEM of claim 1, wherein the lid includes a passive element communicatively coupled with the AWR.

8. The RF FEM of claim 1, wherein the die includes a plurality of vias that are to provide electromagnetic (EM) shielding to the active portion.

9. A microelectronic package that includes:
a die for use in a radio frequency (RF) front-end module (FEM), wherein the die includes:
an active portion in a substrate of the die, and wherein the active portion includes active RF circuitry, and
an acoustic wave resonator (AWR) portion adjacent to the active portion, wherein the AWR portion includes an AWR;
a heat spreader coupled with the die; and
a package substrate coupled with the die such that the die is positioned between the package substrate and the heat spreader, the package substrate includes a thermal element that is thermally coupled with the die, and the thermal element includes a blind via or a metal slug.

10. The microelectronic package of claim 9, wherein the heat spreader is coupled with the active portion of the die.

11. The microelectronic package of claim 10, wherein the heat spreader is physically separated from the die at the AWR portion.

12. The microelectronic package of claim 9, wherein the package substrate includes a passive element that is communicatively coupled with the die.

13. The microelectronic package of claim 9, wherein the thermal element is adjacent to the active portion, and wherein the thermal element does not overlap the AWR portion.

14. The microelectronic package of claim 9, further comprising:
a passives substrate coupled with the die.

15. A microelectronic package comprising:
a die for use in a radio frequency (RF) front-end module (FEM), wherein the die includes:
an active portion that includes active RF circuitry, and
an acoustic wave resonator (AWR) portion, wherein the AWR portion includes an AWR;
a package substrate coupled with a first side of the die; and
a passives substrate coupled with a second side of the die that is opposite the first side of the die.

16. The microelectronic package of claim 15, wherein the passives substrate includes a capacitor, a resistor, or an inductor.

17. The microelectronic package of claim 15, wherein the passives substrate is communicatively coupled with the package substrate by an interconnect physically coupled with, and positioned between, the passives substrate and the package substrate.

18. The microelectronic package of claim 15, wherein the passives substrate is communicatively coupled with the package substrate by a conductive pathway in the die.

19. The microelectronic package of claim 15, wherein the package substrate includes a thermal element that is thermally coupled with the die.

20. The microelectronic package of claim 19, wherein the thermal element includes a blind via, a stacked via, or a metal slug.

* * * * *